United States Patent [19]

Matsumoto

[11] Patent Number: 4,944,650
[45] Date of Patent: Jul. 31, 1990

[54] APPARATUS FOR DETECTING AND CENTERING WAFER

[75] Inventor: Tatsumi Matsumoto, Nagareyama, Japan

[73] Assignee: Mitsubishi Kinzoku Kabushiki Kaisha, Tokyo, Japan

[21] Appl. No.: 263,726

[22] Filed: Oct. 28, 1988

[30] Foreign Application Priority Data

Nov. 2, 1987 [JP] Japan .................................. 62-277896

[51] Int. Cl.$^5$ .................................................. B65J 1/00
[52] U.S. Cl. ................................... 414/757; 414/754; 414/781; 414/783; 901/30; 294/103.1
[58] Field of Search ................ 414/754, 757, 777, 778, 414/779, 780, 781, 783, 784; 901/30; 198/394, 395; 294/103.1; 406/87

[56] References Cited

U.S. PATENT DOCUMENTS

| | | | |
|---|---|---|---|
| 3,297,134 | 1/1967 | Pastuszak | 414/757 X |
| 3,466,514 | 9/1969 | Brunner et al. | 414/754 X |
| 3,820,647 | 6/1974 | Waugh, Jr. et al. | 414/757 X |
| 4,483,434 | 11/1984 | Miwa et al. | 414/757 X |
| 4,639,028 | 1/1987 | Olson | 294/103.1 X |
| 4,813,732 | 3/1989 | Klem | 901/30 X |

FOREIGN PATENT DOCUMENTS

| | | | |
|---|---|---|---|
| 0017919 | 1/1985 | Japan | 414/783 |
| 0879681 | 12/1981 | U.S.S.R. | 414/781 |

Primary Examiner—Joseph J. Rolla
Assistant Examiner—Boris Milef
Attorney, Agent, or Firm—Scully, Scott, Murphy & Presser

[57] ABSTRACT

An apparatus for detecting an orientation flat of a wafer and centering the wafer includes a hand base, a pair of guide rollers mounted on the hand base, and a stopper mechanism mounted on the hand base. The hand base is operable to be located in opposed relation to one of opposite faces of the wafer, and has an axis therealong. The guide rollers serve to support the wafer located in opposed relation to the hand base, and are symmetrically disposed with respect to the axis of the hand base. The stopper mechanism cooperates with the pair of guide rollers to center the wafer, and are movable along the axis of the hand base and engageable with the orientation flat of the wafer.

5 Claims, 2 Drawing Sheets

FIG.1 FIG.2
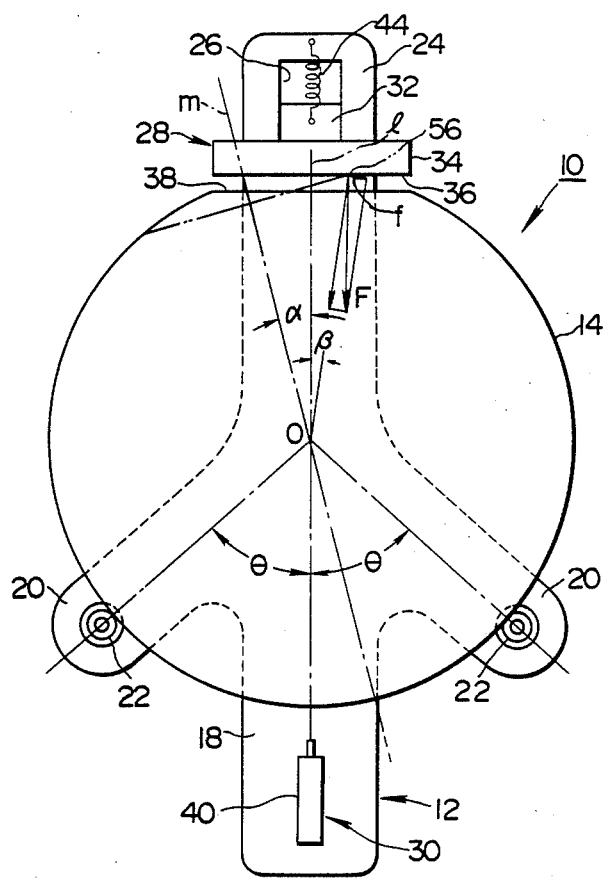
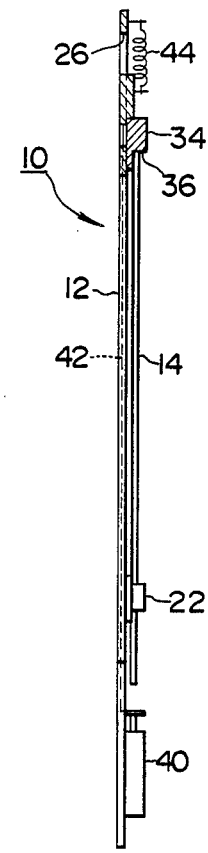

APPARATUS FOR DETECTING AND CENTERING WAFER

BACKGROUND OF THE INVENTION

1. Field of the Invention

The present invention pertains to an apparatus for detecting an orientation flat of a water and centering the wafer.

2. Prior Art

An orientation flat of a wafer has hitherto been detected by lining and rotating the wafer, sensing the opposite ends of the orientation flat by means of an optical sensor, calculating the angle therebetween based on the amount of rotation in a stepping motor, and correcting the results until a half of the angle is brought into a prescribed position.

Further, the centering of the wafer has been carried out by dropping the wafer into a funnel shaped recess and vibrating it to make the wafer level, or by placing the wafer on a rotating table and sensing the deviation of the outer periphery of the wafer from the center of rotation of the table to compensate the deviation.

Thus, the detection of the orientation flat and the centering of the wafer have hitherto been carred out separately by each exclusive mechanism.

Further, the conventional orientation flat detecting apparatus has the disadvantages that the accuracy in the detection of the opposite ends of the orientation flat is very low. Besides, the apparatus itself is intricate in structure and requires a lot of space for installation. The conventional centering apparatus also has the disadvantages similar to those in the orientation flat detecting apparatus.

SUMMARY OF THE INVENTION

It is therefore an object of the invention to provide a detecting and centering apparatus which can detect the orientation flat of a wafer and center the wafer with a high accuracy at a time, and in which space required for installation is considerably saved.

According to the present invention, there is provided an apparatus for detecting an orientation flat of a wafer and centering the wafer, comprising a hand base operable to be located in opposed relation to one of opposite faces of the wafer, the hand base having an axis therealong; a pair of guide means mounted on the hand base for supporting the wafer located in opposed relation to the hand base, the guide means being symmetrically disposed with respect to the axis of the hand base; and stopper means mounted on the hand base for cooperating with the pair of guide means to center the wafer, the stopper means being movable along the axis of the hand base and engageable with the orientation flat of the wafer.

BREIF DESCRIPTION OF THE DRAWINGS

FIG. 1 is a front elevation of a detecting and centering apparatus provided according to the present invention;

FIG. 2 is a partially cutaway side elevation of the apparatus of FIG. 1.

DESCRIPTION OF THE PREFERRED EMBODIMENT OF THE INVENTION

Figure 3:
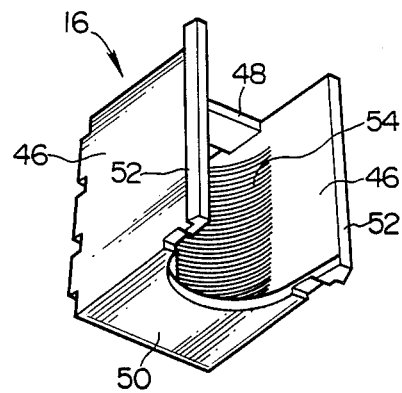
FIG. 3 is a perspective view depicting a cassette for wafers.

Referring to FIGS. 1 and 2 of the accompanying drawings, there is illustrated a wafer detecting and centering apparatus, generally designated at 10, in accordance with the present invention. The apparatus 10 includes a hand base 12 mounted on a transfer apparatus (not shown) such as a robot for taking out a wafer 14 from a wafer cassette 16, so that the base can be moved to and away from a prescribed position opposed to one of opposite faces of the wafer 14. The hand base 12 is comprised of a generally rectangular base body 18 having an axis 1 therealong and a pair of wing portions 20 branching off from the base body 18 so as to be inclined with respect to the base body at a prescribed inclination angle $\theta$. The base body 18 has a center O through which axis of the wafer 14 centered in position is to pass, and the wing portions 20 extend from the central portion of the base body 18 outwardly in a direction away from one end thereof, in such manner that they are symmetrical with respect to the axis 1 of the base body 18. The inclination angle $\theta$ of each wing portion 20 with respect to the axis 1 of the base body 18 should preferably range from 50° to 60°.

A pair of guide means in the form of rollers 22 are respectively mounted on the wing portions 20 of the hand base 12 for supporting the wafer 14 located in opposed relation to the hand base, each roller 22 being spaced from the center O of the hand base 12 by on half of the outer diameter of the wafer 14. The guide rollers 22 are symmetrical disposed with respect to the axis of the base body 18 so as to be rotatable in a plane parallel to the wafer located in opposed relation to the hand base, a line extending between each of the rollers 22 and the center O of the base body 18 being inclined with respect to the axis of the hand base 12 at the above inclination angle $\theta$.

The hand base 12 includes a guide frame 24 formed at the one end of the base body 18 and defining a guide opening 26 extending along the axis of the base body 18. A stopper means movable along the axis 1 of the hand base is mounted on the hand base for cooperating with the pair of guide rollers 22 to center the wafer 14. The stopper means includes a stopper member 28 movable along the axis 1 of the hand base 12 and drive means 30 connected to the stopper member 28 for moving the stopper member 28 toward and away from the wafer 14. The stopper member 28 is comprised of a sliding member 32 recieved in the guide opening 26 of the frame for sliding movement therealong and a stopper plate 34 mounted on the sliding member 32 and having a reference face 36 facing toward the other end of the base body 18 and adapted to be held in contact with an orientation flat 38 of the wafer 14, the reference face 36 being disposed perpendicular to the axis of the hand base 12. The drive means 30 comprises an actuator in the form of a pneumatic cylinder 40 mounted on the other end of the base body 18 and a wire 42 connected between a piston rod of the cylinder 40 and the stopper member 28. Further, an urging means in the form of a compression coil spring 44 is connected between the guide frame 24 and the sliding member 32 of the stopper member 28 for urging the stopper member 28 in a direction away from the other end of the base body 18.

Figure 4:
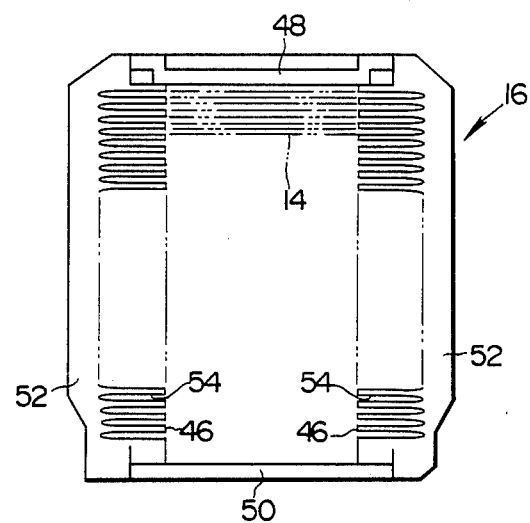
FIG. 4 is a front elevation of the cassette of FIG. 3.

As shown in FIGS. 3 and 4, the wafer cassette 16 is comprised of an opposed pair of side plates 46 and upper and lower support members 48 and 50 connecting the side plates 46 together, the upper support member 48 being of a generally H-shaped while the lower support member 50 is of a generally U-shape. The side plates 46, each of which has an outwardly protruding portion 52 formed at its front edge, are provided with plural pairs of right and left horizontal grooves 54 formed therein, and each wafer 14 is received by each pair of the grooves 54 with its orientation flat 38 directed rearwardly of the cassette 16.

For detecting the orientation flat 38 of the wafer 14 and centering the wafer 14, the transfer apparatus such as a robot is first activated to insert the hand base 12 into the wafer cassette 16 from its lower side to locate it in a position opposed to the wafer 14. Then, the hand base 12 is somewhat lifted and moved so that the guide rollers 22 are brought into contact with the round periphery of wafer 14. In this condition, as shown in FIG. 1, the wafer 14 may be disposed so that its center line m is inclined at an angle $\alpha$ with respect to the axis l of the hand base 12 while the line connecting one end 56 of the orientation flat 38 of the water 14 to the center O is inclined at an angle $\pm \beta$ with respect to the axis l of the hand base 12. The cylinder 40 is then retracted to move the stopper member 28 toward the wafer 14, and the stopper member 28 is brought into contact with the one end 56 of the orientation flat 38 of the wafer 14, so that an urging force as at F is exerted on the wafer 14. The wafer 14, therefore, undergoes a tangential force as at f, which is equal to $F\sin\beta$, and is caused to rotate clockwise or counterclockwise in FIG. 1 until the stopper member 28 is stopped by the wafer 14. When the stopper member 28 is stopped, its reference face 36 is held in close contact with the entire surface of the orientation flat 38 of the wafer 14, and besides the axis of the wafer is brought into alignment with the center of the hand base. Thus, the detection of the orientation flat can be conducted independently of the tolerance in the distance between the center of the wafer 14 and the surface of the orientation flat 38, and both the detection of the orientation flat 38 and the centering of the wafer can be completed at a time.

After the above operations are completed, the hand base 12 is further lifted to hold up the wafer 14 from the groove 54, and is pulled out from the cassette 16 and moved to a next working station.

As described above, the apparatus in accordance with the present invention includes a pair of guide rollers mounted on the hand base so as to be symmetrical with respect to the axis of the hand base and the stopper member disposed on the axis of the hand base so as to be movalbe therealong. Accordingly, the wafer can be rotated until the entire surface of the orientation flat is brought into close contact with the stopper member by urging the stopper member against one end of the orientation flat while holding the wafer through the guide rollers. Therefore, the detection of the orientation flat and the centering of the wafer can be conducted with a high accuracy at one time. Besides, the space for installation can be considerably saved.

Obviously many modifications and variations of the present invention are possible in the light of the above teachings. It is therefore to be understood that within the scope of the appended claims, the invention may be practiced otherwise than as specifically described.

What is claimed is:

1. An apparatus for detecting an orientation flat of a wafer and centering said wafer, comprising:

a hand base operable to be located in opposed relation to one of opposite faces of said wafer, said hand base having first and second ends and an axis along the hand base, and including a guide frame formed at the first end of the hand base and defining a first guide means extending along said axis;

a pair of second guide means mounted on said hand base for supporting said wafer located in opposed relation to said hand base, and second guide means being symmetrically disposed with respect to said axis of said hand base;

stopper means mounted on said hand base for cooperating with said pair of second guide means to center said wafer, said stopper means being accommodated in said first guide means for sliding movement therealong and along said axis of said hand base and engageable with said orientation flat of said wafer; and urging means connected between said guide frame and said stopper means for urging said stopper means in a direction away from the second end of said hand base;

wherein said stopper means comprises a stopper member having a reference face adapted to be held in contact with the orientation flat of said wafer, and drive means connected to said stopper member for moving said stopper member toward and away from said wafer.

2. An apparatus as defined in claim 1, wherein said hand base has a center through which an axis of said wafer centered in position passes, each of said second guide means being comprised of a roller disposed so as to be rotatable in a plane parallel to said wafer located in opposed relation to said hand base, each roller being disposed such that a line extending between the roller and said center of said hand base is inclined with respect to said axis of said hand base at an angle ranging from 50° to 60°.

3. An apparatus as defined in claim 1, wherein said drive means comprises an actuator mounted on said hand base and a wire connected between said actuator and said stopper member.

4. An appartus as defined in claim 3, wherein said hand base comprises a base body having a center through which an axis of said wafer centered in position passes, and a pair of wing portions formed on said hand base so as to be symmetrical with respect to said axis, said second guide means being disposed on said wing portions, respectively.

5. An apparatus as defined in claim 1, wherein the first guide means comprises an opening in the guide frame.

* * * * *

UNITED STATES PATENT AND TRADEMARK OFFICE
CERTIFICATE OF CORRECTION

PATENT NO. : 4,944,650

DATED : July 31, 1990

INVENTOR(S) : Tatsumi Matsumoto

It is certified that error appears in the above-identified patent and that said Letters Patent is hereby corrected as shown below:

Column 1, line 13: "lining" should read as --lifting--

Column 2, line 21: "such manner" should read as --such a manner--

Column 2, line 32: "symmetrical" should read as --symmetrically--

Column 2, line 50: "frame for" should read as --frame 24 for--

Column 3, line 53: "movalbe" should read as --movable--

Signed and Sealed this

Fifth Day of November, 1991

Attest:

HARRY F. MANBECK, JR.

Attesting Officer

Commissioner of Patents and Trademarks